United States Patent
Mimata et al.

(10) Patent No.: US 6,505,397 B1
(45) Date of Patent: Jan. 14, 2003

(54) DIE HOLDING MECHANISM FOR A DIE WITH CONNECTING WIRES THEREON

(75) Inventors: Tsutomu Mimata, Akiruno (JP); Osamu Kakutani, Oume (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 0 days.

(21) Appl. No.: 09/596,681

(22) Filed: Jun. 19, 2000

(30) Foreign Application Priority Data

Jun. 17, 1999 (JP) ............................. 11-171521

(51) Int. Cl.$^7$ ................................................ B23P 19/00
(52) U.S. Cl. .............................. 29/740; 29/743; 29/760; 156/567; 294/64.1; 294/2
(58) Field of Search .......................... 29/740, 743, 759, 29/760, 741; 414/416.09; 156/567, 584; 74/55; 294/64.1, 2

(56) References Cited

U.S. PATENT DOCUMENTS

| | | | |
|---|---|---|---|
| 3,442,432 A | * 5/1969 | Santangini | 228/44 |
| 3,738,560 A | * 6/1973 | Kulicke, Jr. et al. | 228/10 |
| 3,785,507 A | * 1/1974 | Wiesler et al. | 214/1 |
| 4,290,732 A | * 9/1981 | Taki et al. | 414/752 |
| 4,494,902 A | * 1/1985 | Kuppens et al. | 414/223 |
| 4,915,565 A | * 4/1990 | Bond et al. | 414/225 |
| 6,202,292 B1 | * 3/2001 | Farnworth et al. | 29/743 |
| 2002/0046460 A1 | * 4/2002 | Mimata et al. | 29/740 |

FOREIGN PATENT DOCUMENTS

| | | | |
|---|---|---|---|
| JP | 61-94719 | * | 5/1986 |
| JP | 61-32813 B | | 7/1986 |
| JP | 2-97031 | * | 4/1990 |
| JP | 3-54858 A | | 8/1991 |
| JP | 8-130230 A | | 5/1996 |
| JP | 2725701 B | | 12/1997 |

* cited by examiner

Primary Examiner—Peter Vo
Assistant Examiner—Minh Trinh
(74) Attorney, Agent, or Firm—Koda & Androlia

(57) ABSTRACT

A die holding mechanism comprising a connecting wire receiving shaft which is movable up and down, a pair of die holding levers which have die holding sections for holding the die and are installed so that these levers are free to open and close, and opening-and-closing levers that open and close the die holding levers. A die formed with connecting wires on its upper surface is pushed up by a die push-up device and the wires of the die come into contact with the connecting wire receiving shaft of the die holding mechanism. When the connecting wire receiving shaft is raised by a given amount by the upward movement of the die, the die holding levers are closed so that the die holding sections of the die holding levers are positioned beneath the undersurface of the die. Afterward, the push-up needles of the die push-up device are lowered, resulting in that the die is held by the die holding levers. The die holding mechanism is moved to above a tray or a substrate so that the die is packed in the tray or bonded to the substrate.

3 Claims, 5 Drawing Sheets

DIE HOLDING MECHANISM FOR A DIE WITH CONNECTING WIRES THEREON

BACKGROUND OF THE INVENTION

1. Field of the Invention

The present invention relates to a die holding mechanism which picks up a die formed with connecting wires thereon and to a die packing device which accommodate a die in a tray and further to a die bonding apparatus which bonds a die to a substrate.

2. Prior Art

In recent years, semiconductor devices equipped with dies, which have connecting wires for absorbing the difference in thermal expansion between the die and the substrate, have been developed.

More specifically, as seen from FIG. 5(a), a die 1 is provided with connecting wires 2, and solder bumps 4 are formed by printing on a substrate 3 at positions that correspond to the connecting wires 2. A semiconductor device 5 is made by bonding the connecting wires 2 of the die 1 to the solder bumps 4 of the substrate 3 as shown in FIG. 5(b). In such a semiconductor device 5, the difference in thermal expansion between the die 1 and the substrate 3 is absorbed by the connecting wires 2.

In the above-described die 1, the connecting wires 2 are formed by a wire bonding method when the die 1 is in a state of wafer as shown in FIG. 6. After the wires are formed, a wafer 7 is pasted to a wafer sheet 6 and then finely divided in the longitudinal and lateral directions. An individual die 1 is thus obtained. The die is sent to a next process "as is" in this state, or it is sent to the next process after the wafer sheet 6 is expanded so that the gaps between the dies 1 are widened. In some cases, the wafer 7 is pasted to the wafer sheet 6, and then connecting wires 2 are formed by wire bonding.

When the die 1 thus pasted with the wafer sheet 6 is packed in a tray or bonded to a substrate 3, it is necessary to pick up the die 1 from the wafer sheet 6 by a die holding mechanism.

In one of conventional die holding mechanisms, the vacuum suction surface of a vacuum suction nozzle that vacuum-chucks a die 1 is formed flat. This is disclosed in Japanese Patent Application Publication (Kokoku) No. S61-32813. The vacuum suction surface can be formed as a pyramidal surface as shown in, for instance, Japanese Patent Application Publication (Kokoku) No. H3-54858. Japanese Patent Application Laid-Open (Kokai) No. H8-130230 and Japanese Patent No. 2725701, for instance, disclose mechanisms in which a die picked up by a die holding mechanism is inverted or brought upside-down and bonded to a substrate.

However, in the above prior art, if a die is provided with connecting wires, such a die cannot be vacuum-suctioned by the flat type vacuum suction nozzle. In the case of a pyramidal vacuum suction nozzle, the pyramidal surface contacts the connecting wires and causes deformation in the connecting wires. Furthermore, the die tends drop from the pyramidal surface by the spring force of the connecting wires. Accordingly, a die is not held well by vacuum suction that uses a pyramidal vacuum suction nozzle, either.

Thus, the question has been how to pickup a die that has connecting wires thereon from a wafer sheet.

SUMMARY OF THE INVENTION

Accordingly, the object of the present invention is to provide a die holding mechanism which can pick up a die from a wafer sheet without deforming the connecting wires provided on the die.

Another object of the present invention is to provide a die packing device that packs a die in a tray using (a part of) the die holding mechanism.

Still another object of the present invention is to provide a die bonding apparatus that bonds a die to a substrate using (a part of) the die holding mechanism,.

The above object is accomplished by a unique structure of the present invention for a die holding mechanism that comprises a die push-up means for pushing up a die placed on a wafer sheet and a die holding means for holding the die pushed up by the die push-up means; and in the present invention, the die is provided with wires on an upper surface thereof; the die holding means comprises:
a connecting wire receiving shaft which is installed so as to be moved up and down,
a pair of die holding levers which have die holding sections for holding a die and are installed on both sides of the connecting wire receiving shaft so as to open and close, and
a die holding lever opening-and-closing means which opens and closes the die holding levers; and wherein the die is pushed upward by a push-up needle of the die push-up means, and the connecting wire receiving shaft is pushed upward by the die during the upward movement of the die; and when the connecting wire receiving shaft is raised by a predetermined amount by the die being pushed upward, the die holding levers of the die holding means are closed, so that the die holding sections of the die holding levers hold the die, and thereafter the push-up needle of the die push-up means is lowered, thus allowing the die to be held by the die holding levers.

In the above structure, when the die holding levers hold the die, the die holding sections of the die holding levers are brought beneath the undersurface of the die or brought to the side surfaces of the die.

Furthermore, the die packing device of the present invention is characterized in that the die packing device uses the die holding means describe above in such a manner that the die holding means is installed so as to be movable up and down and moved to above a tray in which dies are to be packed, and a collet which is rotatable and holds a die by vacuum suction is installed above the tray, so that the collet receives the die from the die holding means, inverts the die so as to cause the connecting wires to face down, and then causes the die to be accommodated in the tray.

The die bonding apparatus of the present invention is characterized in that the die bonding apparatus uses the die holding means described above in such a manner that the die holding means is installed so as to be movable up and down and moved to above a substrate to which a die is to be bonded, and a collet which is rotatable and holds a die by vacuum suction is installed above the substrate, so that the collet receives the die from the die holding means, inverts the die so as to cause the connecting wires of the die to face downward, and then causes the die to be bonded to the substrate.

DETAILED DESCRIPTION OF THE PREFERRED EMBODIMENTS

One embodiment of the present invention will be described with reference to FIGS. 1(a) through 3(d).

Figure 1A:
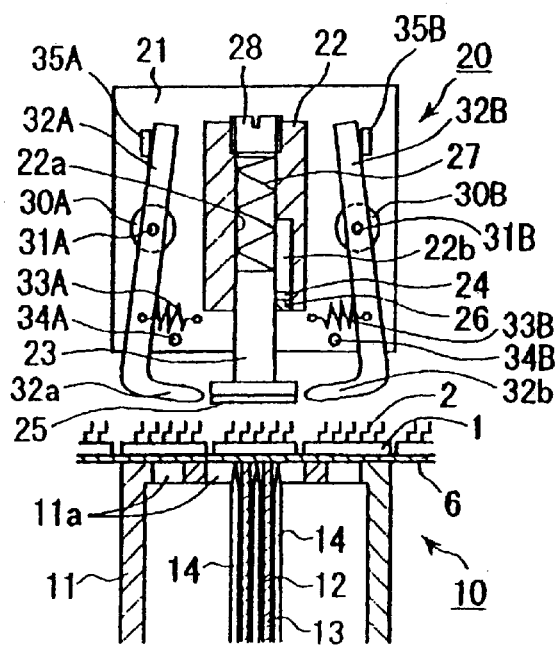
FIGS. 1(a) through 1(d) are sectional views showing the structure and operation of one embodiment of the die holding mechanism according to the present invention.

As shown in FIG. 1(a), the die holding mechanism of this embodiment comprises a die push-up means 10 and a die holding means 20.

The die push-up means 10 is structured as described below.

A wafer sheet 6 to which dies 1 are pasted is fastened to a frame (not shown) which is movable in the X and Y directions. Each of the dies 1 is provided with connecting wires 2. A wafer suction holding body 11 in which vacuum holes 11a are formed is disposed beneath the wafer sheet 6, and a central push-up needle 12 which pushes up a die 1 is disposed in the center of the wafer suction holding body 11. A push-up cylinder 13 is disposed between the wafer suction holding body 11 and central push-up needle 12 so that the push-up cylinder 13 can move upward and downward. The central push-up needle 12 is positioned at the center of the push-up cylinder 13. A plurality of peripheral push-up needles 14 (only two are shown in drawing) are disposed on the outside of the push-up cylinder 13. These peripheral push-up needles 14 are movable upward and downward so as to push up the peripheral area of the die 1.

With the above structure, the die 1 is pushed up by the push-up cylinder 13, then the die 1 is pushed further upward by the central push-up needle 12 and peripheral push-up needles 14. This die push-up means 10 has the same structure as that described in Japanese Patent Application Publication (Kokoku) No. H3-54858.

The die holding means 20 is structured as described below.

The die holding means 20 includes a movable main body 21. The movable main body 21 is installed so as to be driven upward and downward (i.e., in the Z direction) and in the X and Y directions by a driving means (not shown). A shaft holder 22 which has a shaft hole 22a is provided on this movable main body 21. A connecting wire receiving shaft 23 is disposed in the shaft hole 22a so that the connecting wire receiving shaft 23 is movable upward and downward. A longitudinal groove 22b is formed in the shaft hole 22a, and a pin 24 which is inserted into the longitudinal groove 22b is fastened to the connecting wire receiving shaft 23. A soft member 25 is fastened to the lower end of the connecting wire receiving shaft 23. Furthermore, a stopper 26 which is contacted by the pin 24 is fastened in the lower end portion of the longitudinal groove 22b. A spring 27 is disposed in the shaft hole 22a so that the spring 27 contacts the upper surface of the connecting wire receiving shaft 23. The spring 27 is driven downward by a bolt 28 which is screwed into the connecting wire receiving shaft 23. The spring force of the spring 27 is set so that no excessive driving force is applied to the connecting wires 2 by the connecting wire receiving shaft 23.

Supporting columns 30A and 30B are fastened to the movable main body 21 so as to be on both sides of the shaft holder 22, and supporting shafts 31A and 311B are fastened to the supporting columns 30A and 30B. Die holding levers 32A and 32B are rotatably provided on the supporting shafts 31A and 31B. The die holding levers 32A and 32B are respectively provided with die holding sections 32a and 32b so that the die holding sections 32a and 32b can support the undersurface of the die 1. The die holding sections 32a and 32b protrude inwardly from the lower ends of the die holding levers 32A and 32B. Springs 33A and 33B which drive the die holding levers 32A and 32B in the closing direction (or toward each other) are mounted on the die holding levers 32A and 32B. More specifically, one end of each of the springs 33A and 33B is connected to each of the die holding levers 32A and 32B and another end thereof is connected to the movable main body 21. Stoppers 34A and 34B are fastened to the movable main body 21 so that they regulate the closed position of the die holding levers 32A and 32B. Furthermore, opening-and-closing levers 35A and 35B which open and close the die holding levers 32A and 32B are disposed on the outer sides of the upper end portions of the die holding levers 32A and 32B. The opening-and-closing levers 35A and 35B are driven by a driving means (not shown) installed on the die holding levers 32A and 32B.

The operation of the above die holding mechanism that comprise the die push-up means 10 and the die holding means 20 will be described below.

Figure 1B:
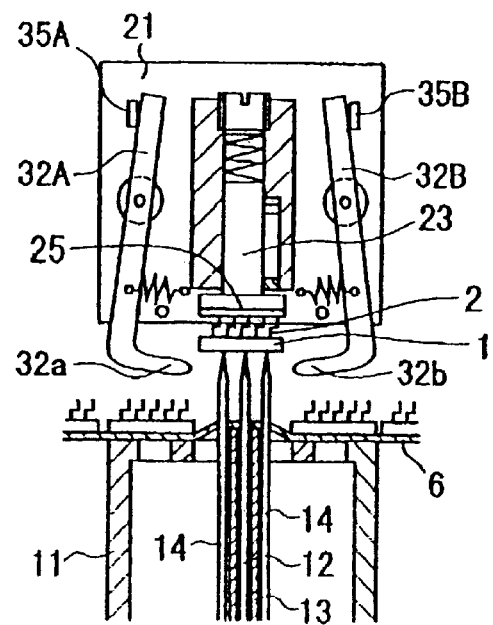

With the wafer sheet 6 held through vacuum suction by the wafer suction holding body 11 as shown in FIG. 1(a), the push-up cylinder 13, central push-up needle 12 and peripheral push-up needles 14 are raised slightly. After this, the central push-up needle 12 and peripheral push-up needles 14 are raised further as shown in FIG. 1(b).

In this case, as a result of the slight rise of the push-up cylinder 13, central push-up needle 12 and peripheral push-up needles 14, the die 1 to be picked up is pushed slightly upward by the push-up cylinder 13; and when the die 1 is thus pushed up slightly by the push-up cylinder 13, the four corners of the die 1 are peeled from the wafer sheet 6.

Furthermore, as a result of the further upward movement of the central push-up needle 12 and peripheral push-up needles 14, the die 1 alone is pushed upward, so that the die 1 is separated from the wafer sheet 6.

During the upward movement of the central push-up needle 12 and peripheral push-up needles 14, the connecting wires 2 of the die 1 come into contact with the undersurface of the soft member 25 of the connecting wire receiving shaft 23, and the connecting wire receiving shaft 23 is raised together with the central push-up needle 12 and peripheral push-up needles 14. The central push-up needle 12 and peripheral push-up needles 14 are raised until the undersurface of the die 1 is positioned slightly above the upper surfaces of the die holding sections 32a and 32b of the die holding levers 32A and 32B.

Figure 1C:
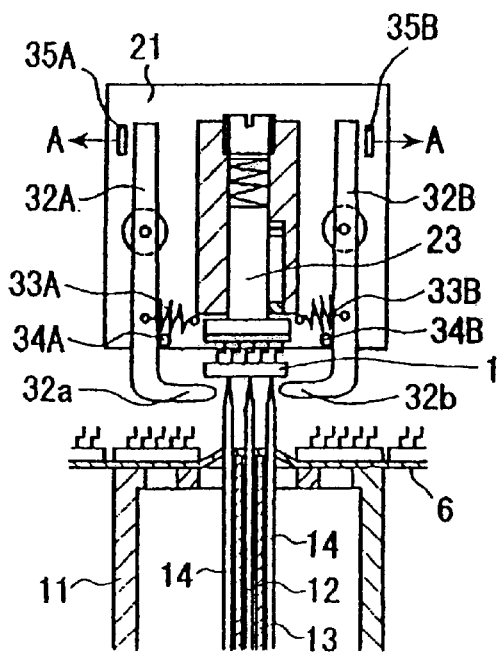

Next, as shown in FIG. 1(c), the opening-and-closing levers 35A and 35B are moved to the outside (as indicated by arrows A). As a result, the die holding levers 32A and 32B are caused by the springs 33A and 33B to pivot inward about the supporting shafts 31A and 31B and contact the stoppers 34A and 34B. Thus, the die holding sections 32a and 32b of the die holding levers 32A and 32B are positioned beneath the die 1.

Figure 1D:
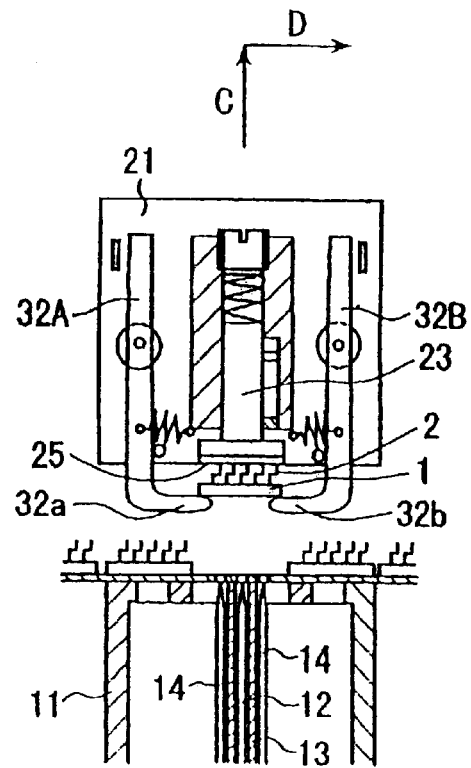

Next, as shown in FIG. 1(d), the push-up cylinder 13, central push-up needle 12 and peripheral push-up needles 14 are lowered. As a result, the die 1 is held between the die holding sections 32a and 32b of the die holding levers 32A and 32B and the soft member 25 of the connecting wire receiving shaft 23.

In the above die holding, the die 1 is held by the die holding sections 32a and 32b of the die holding levers 32A and 32B and the soft member 25 of the connecting wire receiving shaft 23 which is driven by a weak spring force of the spring 27. Accordingly, the die 1 is picked up without causing any deformation of the connecting wires 2.

A die packing device and a die bonding apparatus that use the die holding means as described above will be described.

As shown in FIGS. 2(a) through 2(d) and 3(a) through 3(d), a collet 41 that has a vacuum suction hole 41a for vacuum-chucking a die is disposed so as to be above a tray 40 or substrate 3. The collet 41 makes a 180-degree reciprocating motion so as to face upward and downward. The collet 41 also can be moved upward and downward and in the X and Y directions by a driving means (not shown).

Accordingly, with a die 1 held by the die holding means as shown in FIG. 1(d), the movable main body 21 is moved upward (in the direction of arrow C).

Figure 2A:
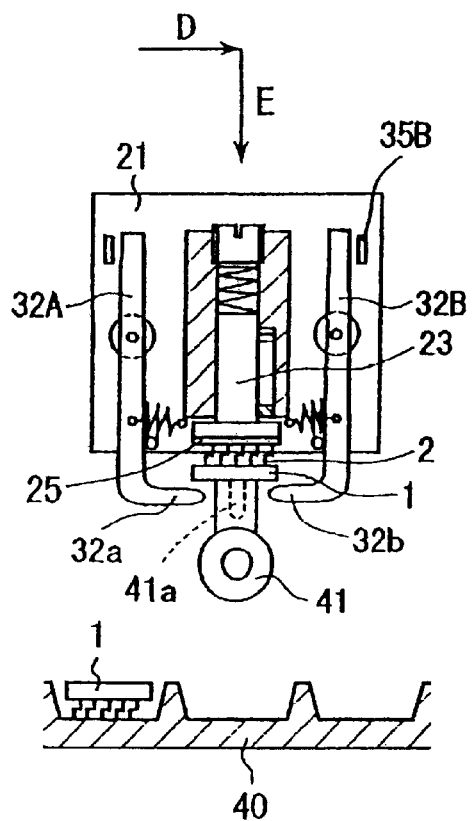
FIGS. 2(a) through 2(d) are sectional views showing the structure and operation of a die packing device that uses the die holding means of the die holding mechanism shown in FIGS. 1(a) through 1(d)
Figure 3A:
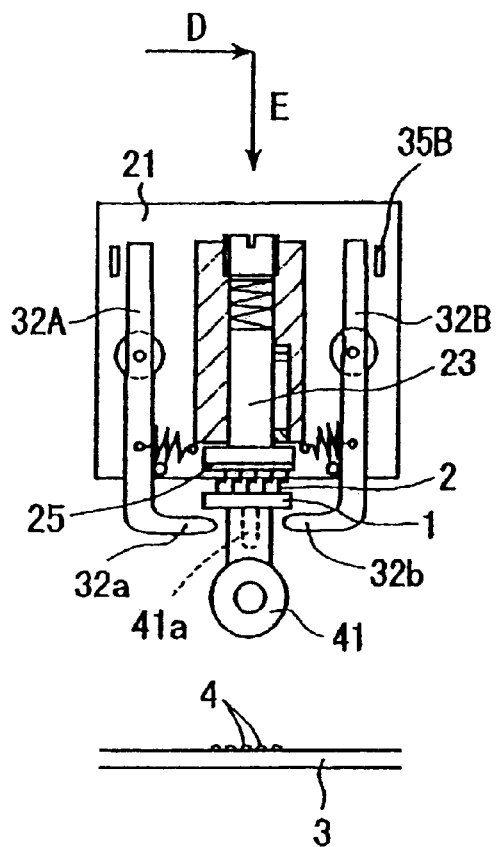
FIGS. 3(a) through 3(d) are sectional views showing the structure and operation of a die bonding apparatus that uses the die holding means of the die holding mechanism shown in FIGS. 1(a) through 1(d)

Next, as shown in FIGS. 2(a) and 3(a), the movable main body 21 is moved (in the direction of arrow D) so as to be at a point above the collet 41.

Then, the movable main body 21 is lowered (in the direction of arrow E) so that the die 1 comes into contact with the collet 41, thus causing the die 1 to be slightly lifted. At the same time, the vacuum of the vacuum suction hole 41a of the collet 41 is switched on, so that the collet 41 holds the die 1 by vacuum suction.

Figure 2B:
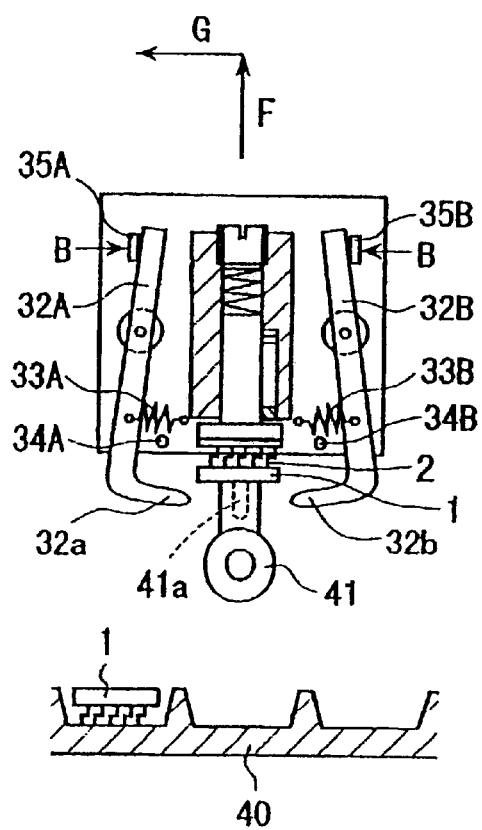
Figure 3B:
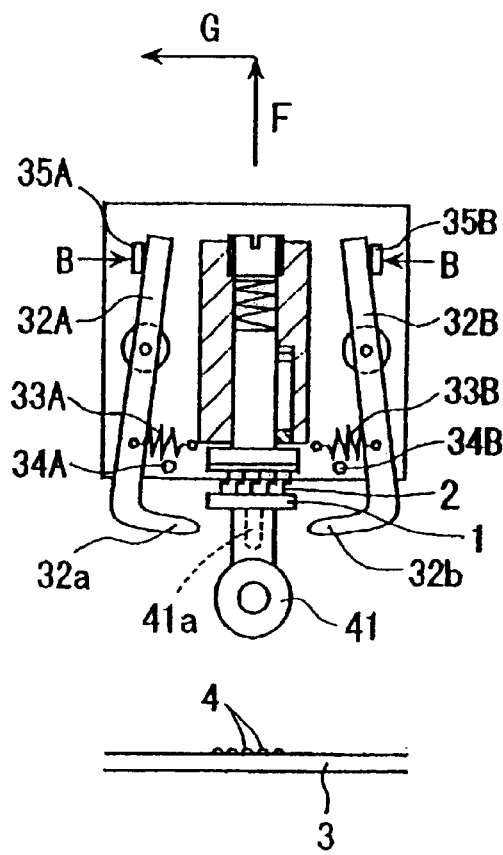

Next, as shown in FIGS. 2(b) and 3(b), the opening-and-closing levers 35A and 35B are moved inward (in the direction of arrows B) and push the die holding levers 32A and 32B. As a result, the die holding sections 32a and 32b of the die holding levers 32A and 32B are opened.

Afterward, the movable main body 21 makes a movement that is the opposite to that described above. In other words, the movable main body 21 is raised in the direction of arrow F, moved in the direction of arrow G so as to be at a point above the die 1 that is to be picked up next, and then lowered. The movable main body 21 thus returns to the state shown in FIG. 1(a).

Figure 2C:
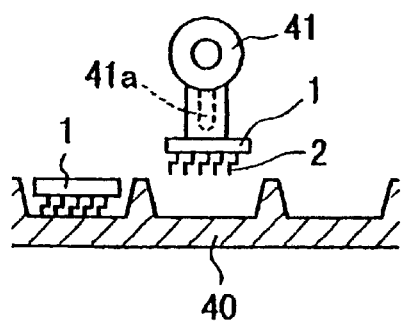
Figure 3C:
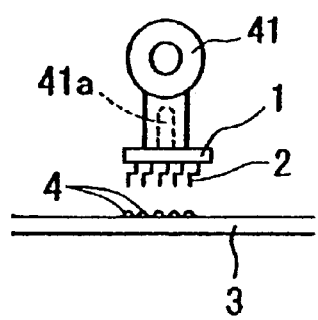

When the movable main body 21 is raised in the direction of arrow F as described above, the collet 41 rotates 180 degrees as shown in FIGS. 2(c) and 3(c) so that the connecting wires 2 face downward.

Figure 2D:
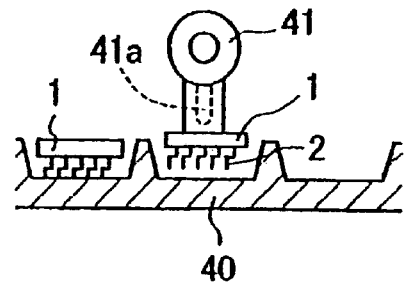

In a case where the die 1 is to be accommodated in a tray 40, as shown in FIG. 2(d), the collet 41 is lowered until the connecting wires 2 are positioned slightly above the accommodating part of the tray 40. Then, the vacuum of the collet 41 is switched off, and the die 1 is accommodated in the tray 40.

Figure 3D:
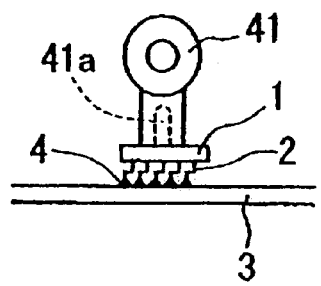

In a case where the die 1 is to be bonded to a substrate 3, as shown in FIG. 3(d), the collet 41 is lowered until the connecting wires 2 are pressed against the solder bumps 4. Then, the vacuum of the collet 41 is switched off. As a result, the connecting wires 2 are connected to the solder bumps 4.

After the die 1 is accommodated in the tray 40 or bonded to the substrate 3, the collet 41 is raised and then rotated 180 degrees in the reverse direction, so that the collet 41 is ready to receive the next die.

FIGS. 4(a) through 4(d) illustrates another embodiment of the present invention.

In the embodiment described above, the undersurface of the die 1 is held by the die holding sections 32a and 32b of the die holding levers 32A and 32B. In the embodiment shown in FIGS. 4(a) through 4(d), the side surfaces of the die 1 are held by the die holding sections 32a and 32b of the die holding levers 32A and 32B.

Figure 4A:
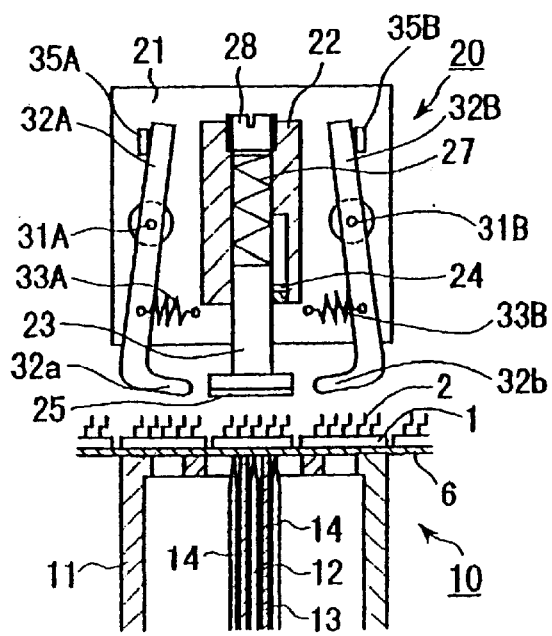
FIGS. 4(a) through 4(d) are sectional views showing the structure and operation of another embodiment of the die holding mechanism according to the present invention.
Figure 4B:
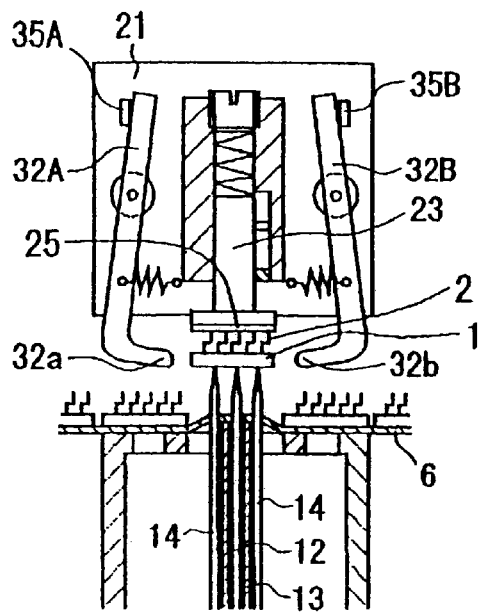

More specifically, with the wafer sheet 6 held by vacuum suction by the wafer suction holding body 11 as shown in FIG. 4(a), the push-up cylinder 13, central push-up needle 12 and peripheral push-up needles 14 are raised slightly. Then, the central push-up needle 12 and peripheral push-up needles 14 are raised further as shown in FIG. 4(b).

As a result of the slight upward movement of the push-up cylinder 13, central push-up needle 12 and peripheral push-up needles 14, the die 1 that is to be picked up is pushed slightly upward by the push-up cylinder 13. When the die 1 is thus pushed up slightly by the push-up cylinder 13, the four corners of the die 1 are peeled from the wafer sheet 6.

In addition, as a result of the further upward movement of the central push-up needle 12 and peripheral push-up needles 14, the die 1 alone is pushed upward, so that the die 1 is separated from the wafer sheet 6.

During the upward movement of the central push-up needle 12 and peripheral push-up needles 14, the connecting wires 2 of the die 1 come into contact with the undersurface of the soft member 25 of the connecting wire receiving shaft 23, and the connecting wire receiving shaft 23 is raised together with the central push-up needle 12 and peripheral push-up needles 14. This operation is the same as that of the previous embodiment shown in FIGS. 1(a) through 1(d). However, the embodiment shown in FIGS. 4(a) through 4(d) differs from the previous embodiment in the amount which the central push-up needle 12 and peripheral push-up needles 14 are raised. In other words, in the embodiment of FIGS. 4(a) through 4(d), the central push-up needle 12 and peripheral push-up needles 14 are set so as to be raised up to the same height level as the die holding sections 32a and 32b of the die holding levers 32A and 32B so that the side surfaces of the die 1 are held by the die holding sections 32a and 32b of the die holding levers 32A and 32B.

Figure 4C:
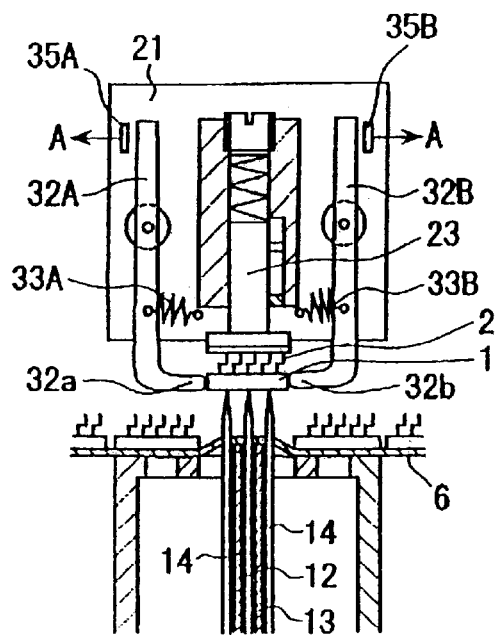

Next, as shown in FIG. 4(c), the opening-and-closing levers 35A and 35B are moved to the outside (as indicated by arrows A). As a result, the die holding levers 32A and 32B are caused by the springs 33A and 33B to pivot inward about the supporting shafts 31A and 31B. Thus, the die holding sections 32a and 32b of the die holding levers 32A and 32B hold the die 1 at its side surfaces.

Figure 4D:
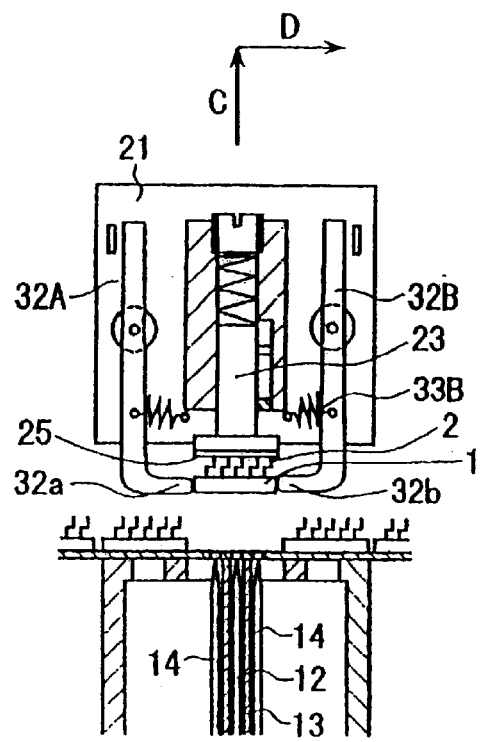
Figure 5A:
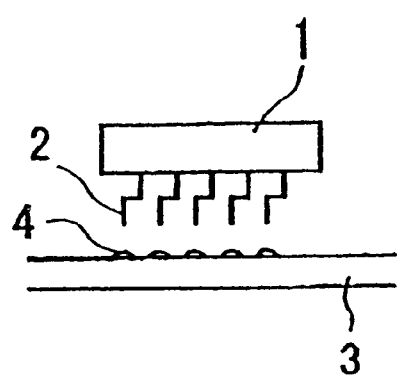
FIGS. 5(a) and 5(b) are explanatory diagrams of a semiconductor device which has connecting wires.
Figure 5B:
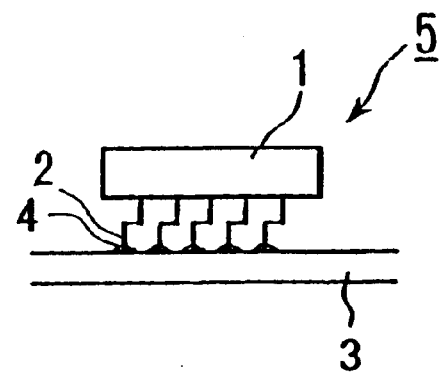
Figure 6:
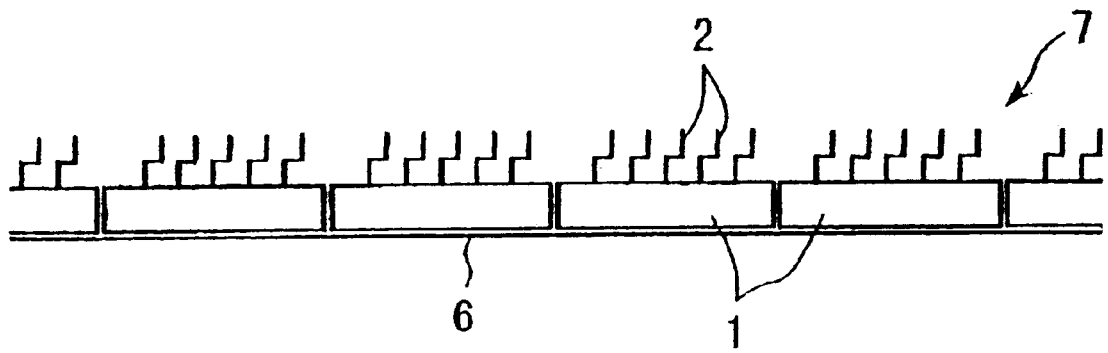
FIG. 6 is an explanatory diagram showing a die pasted to a wafer sheet.

Then, as shown in FIG. 4(d), the push-up cylinder 13, central push-up needle 12 and peripheral push-up needles 14 are lowered.

Thus, the side surfaces of the die 1 are clamped by the die holding sections 32a and 32b of the die holding levers 32A and 32B, and the die 1 is held by the die holding levers 32A and 32B. In this embodiment, the driving force of the springs 33A and 33B is applied to the side surfaces of the die 1. Accordingly, it can be said that the embodiment shown in FIGS. 1(a) through 1(d) is superior to the embodiment of FIGS. 4(a) through 4(d).

In both shown embodiments, the connecting wires 2 have a key shape, and they are bent at right angles. However, it goes without saying that the present invention can be used for dies that have straight connecting wires. Furthermore, the embodiments are described with reference to dies that have connecting wires 2 as shown in the drawings. However, the present invention is applicable to dies which have connection projections and are not suitable for being picked up by a conventional vacuum chucking system.

As seen from the above, the die holding mechanism of the present invention includes a vertically movable connecting wire receiving shaft, a pair of die holding levers which have die holding sections and are installed on both sides of the connecting wire receiving shaft so as to open and close, and a die holding lever opening-and-closing means which opens and closes the die holding levers. A die is pushed upward by a die push-up device, and the connecting wire receiving shaft is pushed upward during the upward movement of the die. When the connecting wire receiving shaft is raised by a predetermined distance, the die holding levers are closed, and the die holding sections of the die holding levers are moved beneath the undersurface of the die or moved on the side surfaces of the die. The push-up needle of the die push-up device is then lowered. The die is thus held by the die holding levers. Accordingly, dies are picked up from a wafer sheet without causing any deformation of the connecting wires and carried to a die packing device or a bonding apparatus.

What is claimed is:

1. A die holding mechanism for a die having connecting wires on an upper surface thereof, said mechanism comprising a die push-up means that pushes up a die which is on a wafer sheet, and a die holding means that holds said die pushed up by said die push-up means, wherein:

said die holding means is provided with a connecting wire receiving shaft which is installed so as to be movable upward and downward for engaging with said connecting wires provided on an upper surface of said die, a pair of die holding levers which have die holding sections for holding said die and are installed on both sides of said connecting wire receiving shaft so that said pair of die holding levers can open and close, and a die holding lever opening-and-closing means which opens and closes said pair of die holding levers; and wherein said die is pushed upward by said die push-up means, and said connecting wire receiving shaft is pushed upward during an upward movement of said die; and when said connecting wire receiving shaft is raised by a predetermined amount, said pair of die holding levers are closed so as to hold said die, and a push-up needle of said die push-up means is lowered, thus allowing said die to be held by said pair of die holding levers.

2. The die holding mechanism according to claim 1, wherein said die holding sections of said pair of die holding levers are positioned beneath an undersurface of said die so as to hold said die.

3. The die holding mechanism according to claim 1, wherein said die holding sections of said pair of die holding levers hold said die at side surfaces of said die.

* * * * *